United States Patent [19]
Molnar

[11] Patent Number: 5,428,316
[45] Date of Patent: Jun. 27, 1995

[54] POWER AMPLIFIER WITH QUIESCENT CURRENT CONTROL

[75] Inventor: Gerald Molnar, Ottawa, Canada

[73] Assignee: Mitel Corporation, Kanata, Canada

[21] Appl. No.: 204,236

[22] PCT Filed: Sep. 3, 1992

[86] PCT No.: PCT/CA92/00381
§ 371 Date: Mar. 4, 1994
§ 102(e) Date: Mar. 4, 1994

[87] PCT Pub. No.: WO93/05572
PCT Pub. Date: Mar. 18, 1993

[30] Foreign Application Priority Data

Sep. 6, 1991 [CA] Canada ................. 2050878

[51] Int. Cl.[6] .............................. H03F 3/45
[52] U.S. Cl. ....................... 330/253; 330/255; 330/258; 330/261
[58] Field of Search ............... 330/253, 255, 258, 261, 330/264, 267, 268, 269, 273, 274, 311

[56] References Cited

U.S. PATENT DOCUMENTS 4,533,876  8/1985  Haque et al. ................. 330/253
4,933,644  6/1990  Fattaruso et al. .......... 330/253 X
5,166,635 11/1992  Shih ............................ 330/255 X

*Primary Examiner*—James B. Mullins
*Attorney, Agent, or Firm*—Marks & Clerk

[57] ABSTRACT

A power amplifier comprises an input stage having a fully differential amplifier with differential inputs and differential outputs, and a high impedance closed loop common mode feedback control circuit deriving common mode feedback control signals from the differential outputs. The output stage of each differential output of the input stage comprises a class AB amplifier having source followers interfacing with the fully differential amplifier. A common mode output voltage control circuit maintains the common mode output voltage of the class AB amplifiers at a desired level. A quiescent current regulator comprises a circuit for mimicking the behavior of one of the source followers to derive a control signal for maintaining the quiescent current of the output transistors at a desired value.

11 Claims, 5 Drawing Sheets

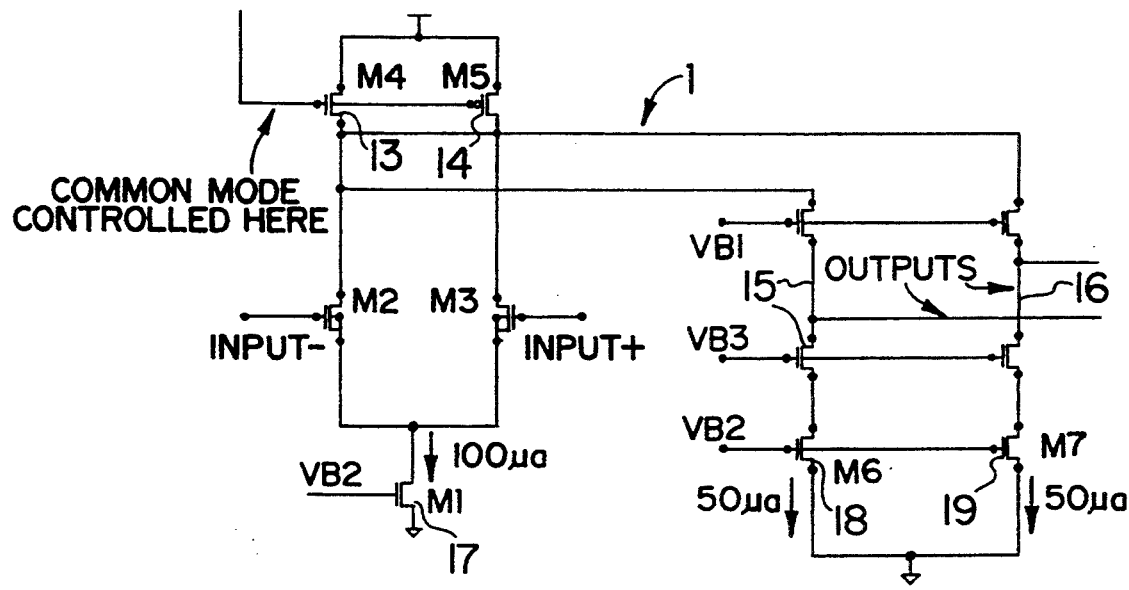
FIG. 3
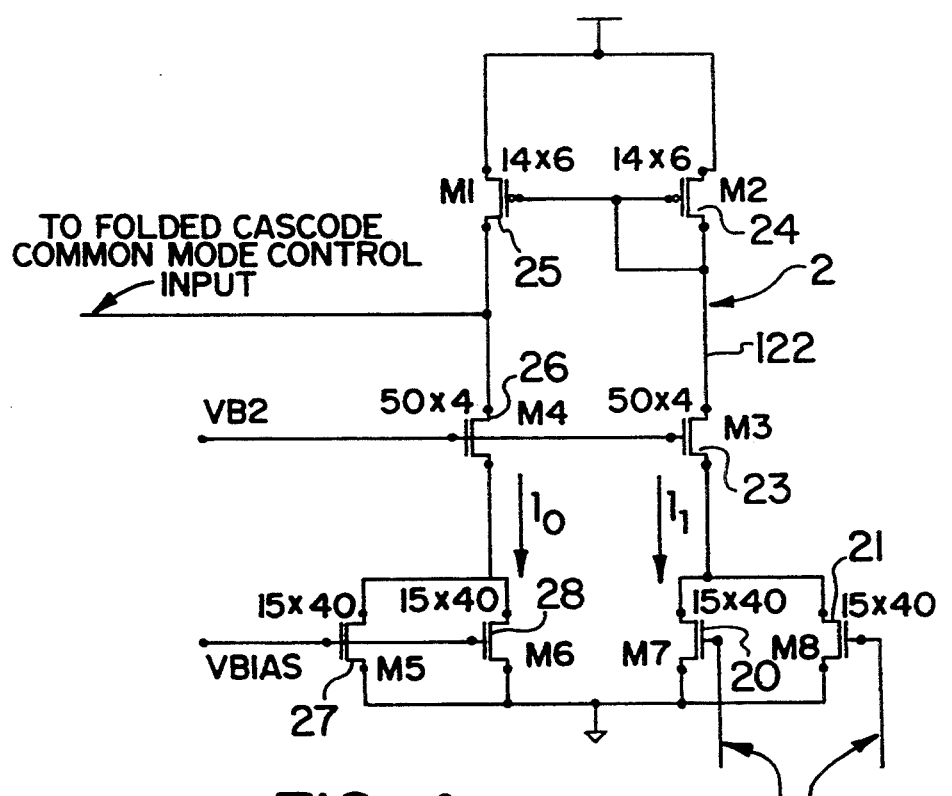
FIG. 4   DIFFERENTIAL OUTPUT OF FOLDED CASCODE

POWER AMPLIFIER WITH QUIESCENT CURRENT CONTROL

This invention relates to a power amplifier with a differential output and differential input, for example, suitable for use as a driver circuit for moving coil transducers, such as earpieces and speakers employed in telephone sets.

Modern telephone circuitry may be implemented in CMOS integrated circuits. Suitable drivers must be provided to interface with discrete moving coil transducer components, such as the earpieces and speakers employed in modern telephone sets. Generally, the drivers must be capable of supplying high power to the load at low D.C. bias voltages, and for this purpose fully differential amplifiers, which have a differential output and differential input, can be employed to advantage because of their ability to produce a high output power from the 5 V CMOS voltage supply (No special power supply is required). The drivers must, however, have linear transfer characteristics, a very high input impedance in order to interface with the CMOS circuitry, a stable frequency response and be insensitive to process variations.

Two major problems must be addressed, namely the control of the common mode voltage associated with fully differential designs and the D.C. quiescent current associated CMOS amplifiers with large output transistors. The high load currents and large dimensions of the output transistors in the amplifier imply a high sensitivity of quiescent current to process variations and biasing. Small deviations in the gate voltages of the output transistors can lead to quiescent currents that greatly exceed desired requirements. Typical such cicuits are described in EP 0325 299, NEUES AUS DER TECHNIK, no. 1, 20 Feb. 1987, page 1, "OPERATIONSVERSTARKER", and IEEE INTERNATIONAL SOLID STATE CIRCUITS CONFERENCE, Vol. 34, February 1991, New York, U.S., pages 278–279 G Nicollini et al. "A-78db THD 100 OHM DIFFERENTIAL DRIVER FOR ISDN APPLICATIONS".

The driver should also have high gain, inherent stability and simplicity of implementation. These features have proved difficult in the past to achieve.

According to the present invention there is provided a power amplifier comprising an input stage having a fully differential amplifier with differential inputs and differential outputs, and a high input impedance closed loop common mode feedback control circuit deriving common mode feedback control signals from said differential outputs; and an output stage comprising for each differential output of the input stage a class AB amplifier having source followers interfacing with said fully differential amplifier and a quiescent current control input for maintaining a desired quiescent current, means for maintaining the common mode output voltage of the class AB amplifiers at a desired level, and a quiescent current regulator for supplying a control signal to said quiescent current control inputs, said quiescent current regulator comprising means for mimicking the behaviour of one of said source followers to derive said control signal.

The quiescent current regulator preferably includes a pair of transistors that mimic the N-channel source follower of one of the class AB amplifiers. The gate of one of the mimic transistors is set to the quiescent state voltage of the input stage output. The drain voltage of the second mimic transistor corresponds to the drain voltage of one of a pair of transistors forming the N-channel follower connected to the gate of the N-channel driver transistor in the output stage and thus represents its gate voltage. The gate voltage of the second mimic transistor is used to bias the N-channel source follower of the output stage. A reference voltage generated at the input of the quiescent current regulator is effectively mirrored into the N-channel driver transistor of the output stage and can thus be used to determine the quiescent current of the output stage. This circuit results in an amplifier quiescent current that is insensitive to process variations.

The present invention is of two-stage design, in which the input stage is a preferably a folded cascode amplifier, which is characterized by high open loop gain and inherent stability.

In view of the poor output drive capability of the folded cascode amplifier, the common mode voltage control feedback circuit is required to have a very high input impedance (very much greater than 1 Megohm) to the folded cascode amplifier output to prevent the common mode feedback circuit from loading down the first stage and thus reducing its gain. The common mode feedback circuit should also operate in the linear fashion over a wide range of input voltage. Conventional designs are very difficult to realize in, for example, a two micron fabrication process. Thus, the common mode feedback control circuit preferably has a pair of transistors operating in the triode region as a pair of voltage dependent resistors connected to the differential outputs of the folded cascode. Summed current through these transistors is matched a control current used to determine the control signal to the folded cascode common mode control input.

The invention will now be described in more detail, by way of example only, with reference to the accompanying drawings, in which:

FIG. 3 shows the input stage of the circuit, represented by Stage I in FIG. 1;

FIG. 4 shows the common mode feedback control circuit.

Figure 1:
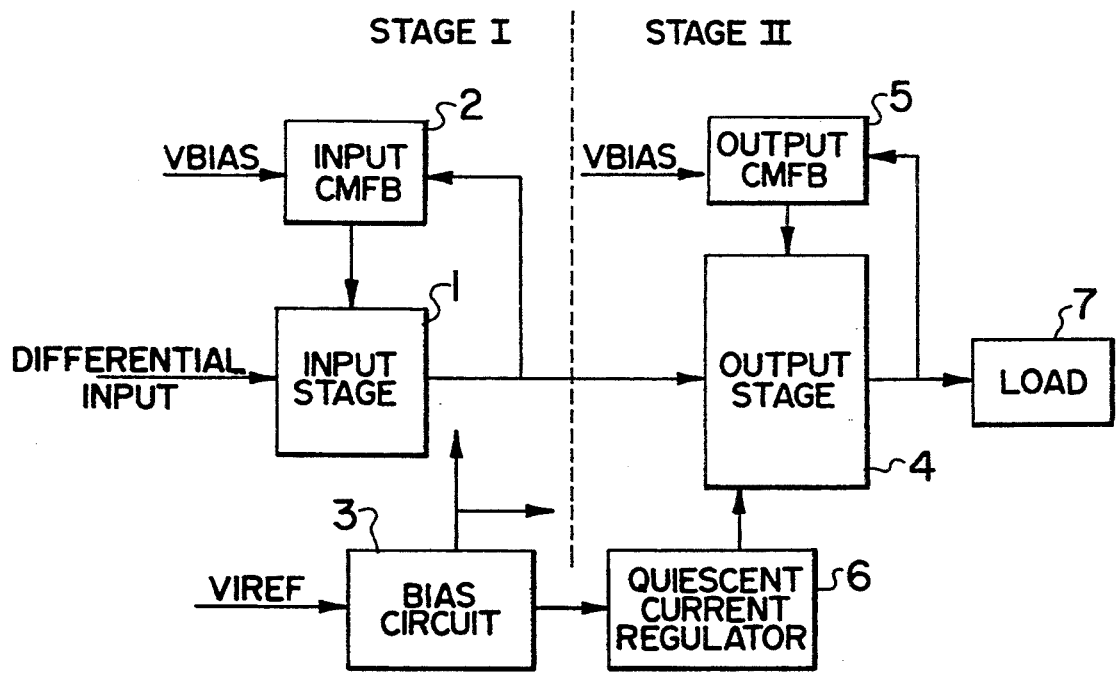
FIG. 1 is a block diagram of a power amplifier in accordance with the invention.

Referring now to FIG. 1, the driver is broadly divided into two stages, Stage I and Stage II. Stage I includes an input stage 1 receiving a differential input, a common mode feedback control circuit 2, and a circuit 3 for generating bias voltages. The second stage, Stage II comprises an output stage. 4, an output common mode feedback control circuit 5, a quiescent current regulator 6, and a load 7, which may be a speaker or earpiece. The entire circuit, except of course the load, is implemented in two micron CMOS technology.

Figure 2:
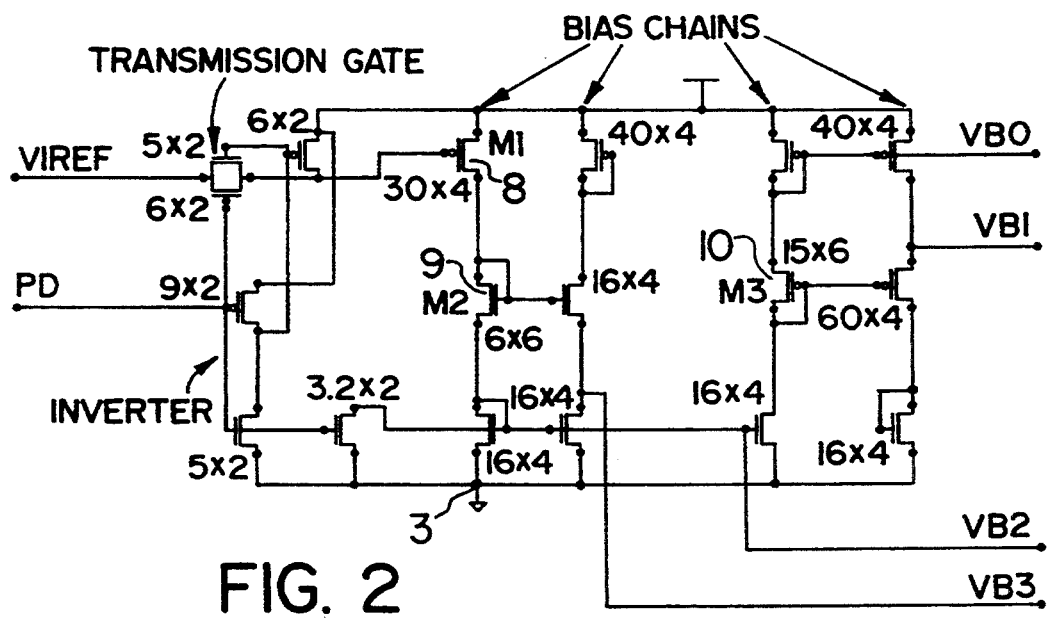
FIG. 2 is a circuit diagram of a bias circuit for the amplifier.

The bias circuit is shown in more detail in FIG. 2. Its main purpose is to provide various reference voltages, Vb0, Vb1, Vb2, Vb3 that track changes due to process variations and external factors (temperature, voltage, etc.) and ensure that the circuits using the bias voltages can be made invariant to these influences.

The bias circuit 3, shown in more detail in FIG. 2, includes field effect transistors 8, 9, and 10. A voltage reference $V_{iref}$ is applied to the circuit and calibrated such that transistor 8 serves as a 20 μa current source. This reference current is mirrored throughout the transistor chains of the bias network to create the precise reference voltages referred to above. Since each reference voltage Vb0, Vb1, Vb2, Vb3 is related to the 20 μa current source, precision current sources can be realized within the amplifier design. Transistors 9 and 10 are made smaller than the transistors in the associated bias chains to ensure that these latter transistors operate in their respective saturation regions.

The input Pd is a power down input signal, which ensures that all currents in the bias chains are reduced to zero on power down. Subsequently, all other current sources within the driver circuit that utilize Vb0 to Vb3 are shut down.

Referring now to FIG. 3, the input stage I provides most of the open loop gain for the amplifier circuit. The input stage I plays a major role in influencing PSRR, CMRR, noise and other amplifier characteristics. The input stage is therefore implemented as a fully differential folded cascode amplifier with a differential input and differential output. This approach affords high gain (greater than 60 db), inherent stability, and simplicity of implementation.

The differential input has input transistors 11, 12 with respective series transistors 13, 14, having their gates connected together and providing a control input for the stage I output common mode voltage feedback control signal. The outputs of the transistors 11, 12 are connected to transistor chains 5 15, 16 to which are applied the bias voltage Vb1, Vb2 and Vb3. The outputs of the transistor chains 15, 16 provide the fully differential outputs of the folded cascode amplifier.

The folded cascode implementation has the advantage of providing high gain (greater than 60 dB), inherent stability (folded cascode designs are compensated by the load capacitance), and simplicity of implementation (a small number of transistors).

Transistor 17 provides a 100 μa current source for the differential input path 11, 12. Transistors 11, 12 are misfits, which have a channel length of 3 μm to promote better matching, i.e minimize output differential offset. The channel width ($g_m$) associated with these devices (300 μm) has a major impact on the overall gain of the first stage. The sizes of transistors 13, 14, and 18, 19 and bias chains 15, 16, are all directly related to the size of the transistors in the reference current (20 μa) of the bias chain.

The differential output signals of the first stage are biased at a DC common mode voltage equal to Vdd/2 (Vbias). The common mode output voltage is controlled by varying the gate voltage of transistors 13, 14.

FIG. 4 shows the common mode feedback control circuit, which is implemented in a novel manner. The circuit provides common mode output voltage control of a 5 V folded cascode operational amplifier, very high input impedance of the folded cascode output, and is capable of linear operation during high voltage swings.

The common mode feedback control circuit comprises a pair of transistors 20, 21 connected to the fully differential output of the input stage 1. Transistors 20, 21 are connected in a first path 22 with series transistors 23, 24. Current $I_1$ flows through this path into transistors 20, 21. This path is in parallel with the second path consisting of series transistors 25, 26 and the parallel combination of transistors 27, 28 receiving at their gate, bias voltage $V_{bias}$.

Transistors 27, 28 function as current sources with current $I_0$ being a function of the reference voltage $V_{bias}$. The gate voltage transistor 25 must be such that the drain current is equal to $I_0$. Once transistors 24 and 25 are matched and the gate voltage is common, $I_0$ must be equal to $I_1$ and hence the drain currents of transistors 20, 21 must sum to $I_0$. This is only be true if the common mode voltage or at the output of the folded cascode is equal to $V_{bias}$.

The transistors 20, 21 thus act as voltage dependent resistors. In order to ensure linearity over wide swings of gate voltage, they are operated in the triode region, and this is accomplished by forcing the drains of transistors 27, 28, 20, 21 to a low voltage with transistors 23, 26. The absolute value of $I_0$ is determined by the size of transistors 27, 28 and the value of the voltage $V_{bias}$. These transistors have a high impedance (W=15 μm, L=40 μm) in order to keep the circuit current low.

Figure 5:
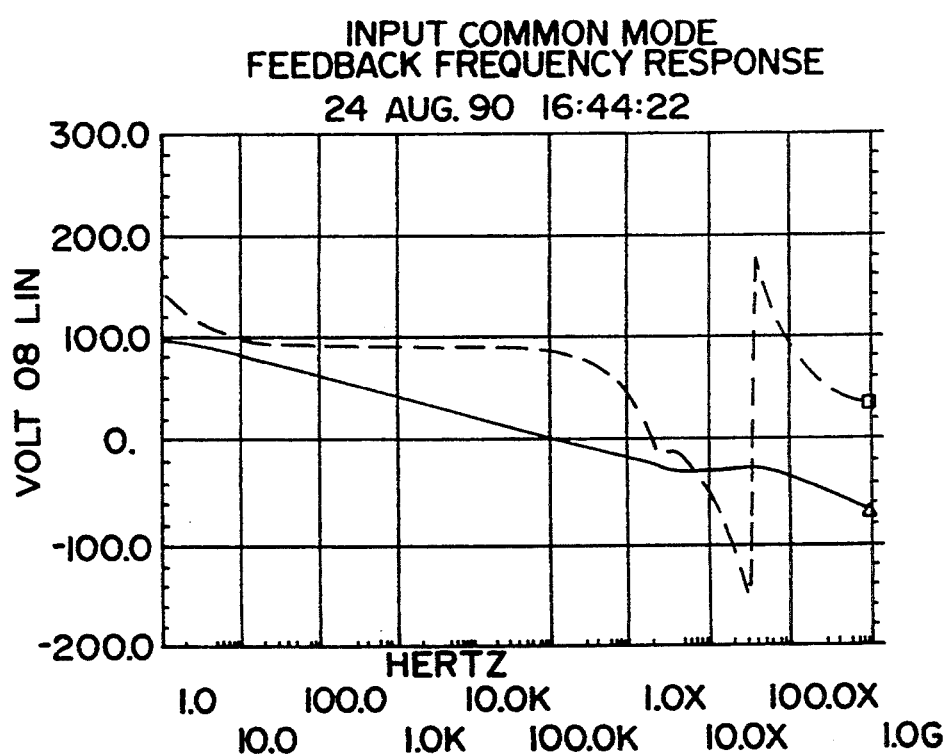
FIG. 5 shows a loop response of the common mode control circuit.
Figure 6:
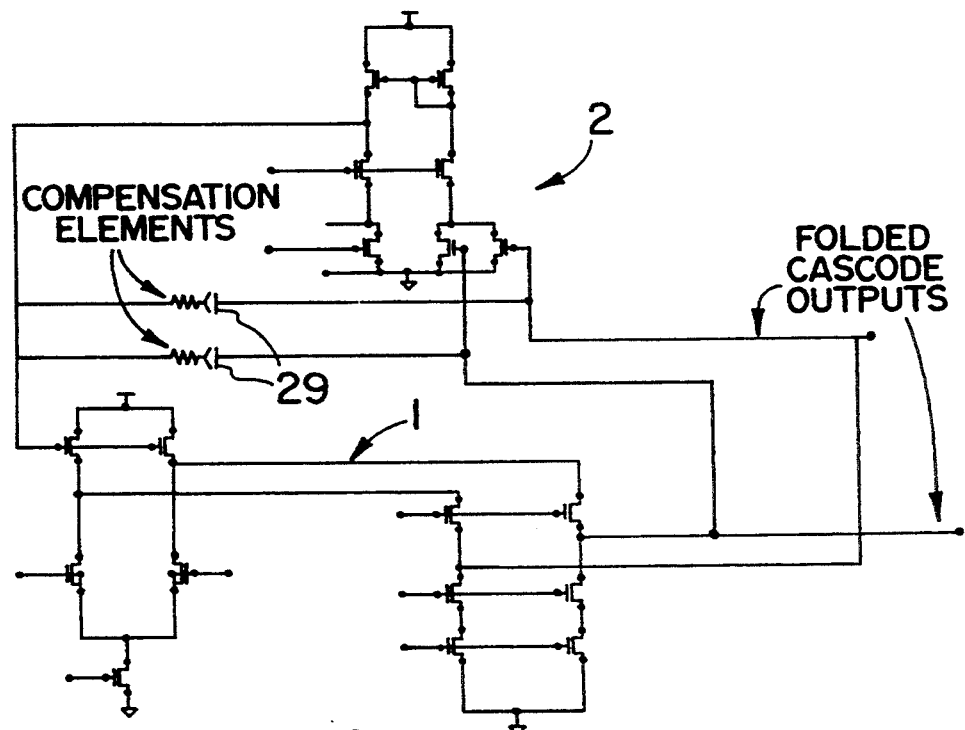
FIG. 6 shows the first stage with common mode control compensation element.

Since the common mode control is a closed loop system, stability is important. To quantify the gain and phase response, the closed loop must be opened and the appropriate measurements taken (see FIG. 5). Compensation elements can then be added to compensate for the frequency response. FIG. 6 shows the input stage 1 and common mode feedback control circuit 2 with compensation elements 29.

Figure 7:
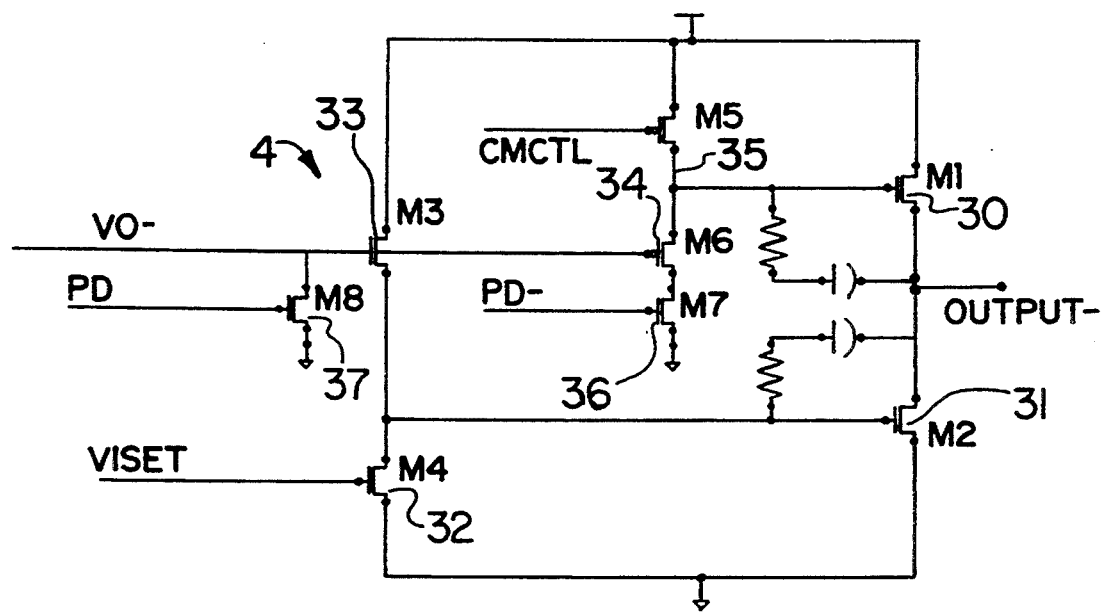
FIG. 7 is a circuit diagram of an output stage speaker driver.

FIG. 7 shows an output stage for the amplifier. Two such output stages are provided, one for each differential output of the input Stage I. The main purpose of the circuit shown in FIG. 7 is to buffer, i.e. provide current gain, for the outputs of the folded cascode input stage I.

The circuit shown in FIG. 7 comprises two output transistors, 30, 31 driven in a class AB manner. The size of transistors 30, 31 is determined by the output current (i.e. minimum load resistance or maximum load gm) that the amplifier must drive. N-channel and P-channel source followers, defined by transistors 32, 33 and 34, 35 respectively are provided. In the quiescent state, which is defined at $V_0$ equal to $V_{bias}$ (nominally Vdd/2), the gate voltage of transistor 31 is barely over the threshold, and thus the drain current of transistor 31 defines the quiescent current of the output stage. If $V_{iset}$ is assumed to be a bias voltage that ensures the quiescent drain current of transistor 31 is held at a predetermined level, the quiescent voltage value of the output is controlled by manipulating Vds of transistor 30 given the drain current defined by transistor 31. The gate voltage of transistor 30 is varied by altering the current in the P-channel source follower (transistors 34, 35) by changing the gate voltage of transistor 35. The signal $CM_{CTL}$ is a control signal emanating from the output stage common mode feedback control circuit to be described in more detail below.

Consequently, in the quiescent state the output voltage is fixed at a predetermined value and the supply current drawn by the circuit is controlled. A positive deviation on Vo (the AC signal) results in an increased gate voltage at transistor 31 and a corresponding shut off of transistor 30. A negative deviation of Vo yields an increased turn on of transistor 30 and turn off of transistor 31, thus ensuring the Class AB operating conditions are maintained. Additional transistors 36, 37 ensure that no supply current is used in the power down state.

These transistors have no effect on the circuit during normal operation.

The passive components shown in FIG. 7 ensure AC compensation of the complete driver. In determining the values of these components, the following requirements must be taken into consideration:

Reduction of the quiescent current in M1 and M2 reduces phase margin (increased impedance)

M1 and M2 have large values of $C_{GS}$. The capacitance forms a pole with the output impedance of the source followers.

Figure 8:
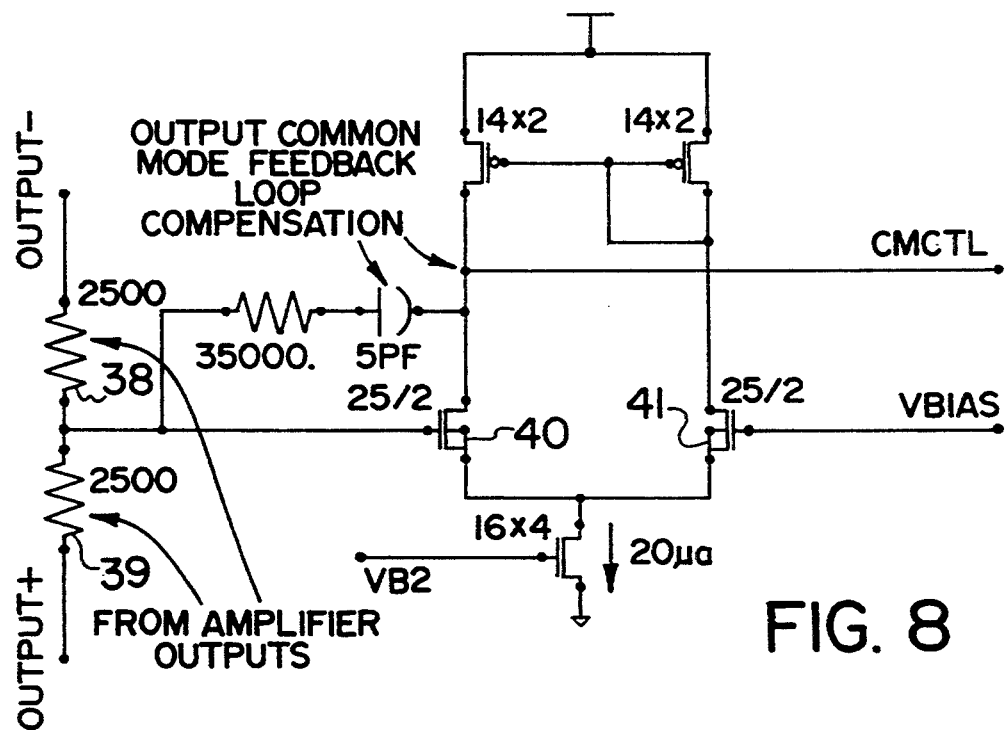
FIG. 8 is circuit diagram of a common mode feedback control circuit for the output stage.

Referring now to FIG. 8, this shows the common mode feedback control circuit for the output stage. The outputs of each amplifier are resistively summed by resistors 38, 39 to extract the common mode voltage. A differential amplifier consisting of transistors 40, 41 is then used to compare this with the bias (nominally VDD/2). The differential amplifier generates the control signal $CM_{CTL}$ (shown in FIG. 7) to generate the output common mode voltage control signal.

Figure 9:
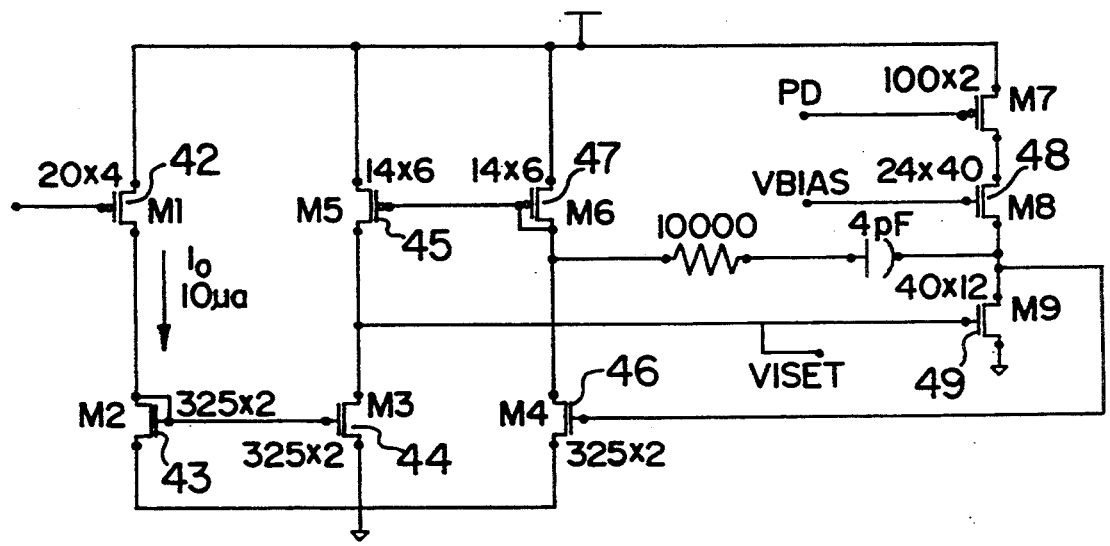
FIG. 9 is a circuit diagram of the quiescent current regulator.

Referring now to FIG. 9, the quiescent current regulator is designed to regulate the output stage quiescent current over wide process and temperature variations. The quiescent current regulator meshes with the output stage to effectively control the quiescent current.

In FIG. 9, transistor 42 forms a 10 μa current source. Transistor 43, in series with transistor 42, is connected as a diode device and thus forms a voltage reference for the circuit. The magnitude of the current $I_o$ and the size of the transistor M2 are both related to quiescent current in the output stage of the amplifier.

The current $I_o$ flowing through transistor 42 is mirrored into transistor 44, which is connected in series with a matched transistor 45. Transistors 44 and 45 are in turn parallel with series combination of transistors 46, 47.

Output transistors 48, 49 have as their main function to mimic the N-channel voltage follower (33, 32) in the output stage (FIG. 7). The gate of transistor 48 is set to $V_{bias}$, which is the desired quiescent state value of the folded cascode output. The drain voltage of transistor 49 is connected to the gate of transistor 46. Transistors 45 and 47 are matched and have a common gate voltages.

The current $I_o$ is mirrored into transistor 44 as previously indicated. The drain current of transistor 44 is the same as the drain current of transistor 45, and due to the matching of transistors 45 and 47, as well as their common gate voltage, the drain current of transistor 47 must equal the drain current of transistor 45. This means that the gate voltage of transistor 46 must be the same as the gate voltage of transistor 44, and this will only occur is adequate loop gain exists from the gate of transistor 46 to the drain of transistor 49.

Since the main function of transistors 48, 49 is to mimic the N-channel voltage follower in the output stage of the amplifier, the drain voltage of transistor 49 represents the gate voltage of the N-channel driver transistor in the output stage (transistor 31, FIG. 7). This means that the voltage at the drain of transistor 49 is related to the output stage quiescent current.

The gate voltage of transistor 49 ($V_{iset}$) can therefore be used to bias the N-channel source followers (transistors 32, 33) of each amplifier in the output stage. The voltage generated at transistor 49 is effectively mirrored into the N-channel driver transistor of the output stage, and the sizing of transistor 43 and the magnitude of $I_0$ determine the quiescent current of the output stage in each amplifier. The above design results in an amplifier quiescent current which is insensitive to process variations.

The above described circuit provides a simple design for a power amplifier that can implemented in CMOS technology in a simple and effective manner, and which is relatively insensitive to variations in process parameters.

I claim:

1. A power amplifier comprising an input stage and an output stage, the input stage having a fully differential amplifier with differential inputs and differential outputs, and a high input impedance closed loop common mode feedback control circuit deriving common mode feedback control signals from said differential outputs, said output stage comprising for each differential output of the input stage a class AB amplifier providing an output of the power amplifier and having N-channel and P-channel source followers interfacing with said fully differential amplifier and a quiescent current control input for maintaining a desired quiescent current, means for maintaining the common mode output voltage of the class AB amplifiers at a desired level, and a quiescent current regulator for supplying a common control signal to said quiescent current control inputs, said quiescent current regulator including transistor means configured to mimic the behaviour of one of said source followers to generate said common control signal.

2. A power amplifier comprising an input stage and an output stage, the input stage having a fully differential amplifier with differential inputs and differential outputs, and a high input impedance closed loop common mode feedback control circuit deriving common mode feedback control signals from said differential outputs, said output stage comprising for each differential output of the input stage a class AB amplifier having N-channel and P-channel source followers interfacing with said fully differential amplifier and a quiescent current control input for maintaining a desired quiescent current, means for maintaining the common mode output voltage of the class AB amplifiers at a desired level, and a quiescent current regulator for supplying a common control signal to said quiescent current control inputs, said quiescent current regulator comprising a pair of transistors that mimic one of the source followers of one of the class AB amplifiers, the gate of one of the mimic transistors being set to the quiescent state voltage of the input stage output, the drain voltage of the second mimic transistor corresponding to the drain voltage of one of a pair of transistors forming said one follower which is connected to the gate of an associated driver transistor in the output stage, and the gate voltage of the second mimic transistor being used to bias said one source follower of the output stage, whereby a reference voltage generated at the input of the quiescent current regulator is effectively mirrored into the associated driver transistor of the output stage and determines the quiescent current of the output stage.

3. A power amplifier as claimed in claim 2, characterized in that said one source follower is the N-channel source follower and said associated driver transistor is the N-channel driver transistor.

4. A power amplifier as claimed in claim 2, characterized in that for each class AB amplifier a first of said source followers maintains the gate voltage of one driver transistor just over threshold value in the quiescent state so that the drain current of said driver transistor determines the quiescent current of the output stage and having a control input determining the level of said quiescent driver current, and a second of said followers determines the quiescent voltage output by determining the source-drain voltage of the other of said class AB driver transistors in response to an output common mode feedback control signal.

5. A power amplifier as claimed in claim 4, further comprising means for summing the separate outputs for each class AB driver amplifier, and a differential amplifier for comparing the result of the summation to a reference voltage to produce said output common mode control signal.

6. A power amplifier as claimed in claim 5, characterized in that said quiescent current regulator further comprises a current source transistor supplying current to a diode-connected transistor providing said reference voltage source, a first transistor having its gate connected to said diode-connected transistor so that the current generated by the current source transistor is mirrored thereinto, said first transistor being in series with a second transistor, and said first and second transistors being in parallel with a series combination of third and fourth transistors, the said second and fourth transistors being matched and their gates being connected together such that the driver current in the second and fourth transistors is the same, the drain of said one of said mimic transistors being connected to the gate of the third transistor, and the gate of said one mimic transistor being connected to the drain of the first transistor.

7. A power amplifier as claimed in claim 2, characterized in that said amplifier of the input stage is a folded cascode amplifier.

8. A power amplifier as claimed in claim 7, characterized in that said common mode feedback control circuit comprises a pair of voltage-dependent resistor means connected to said differential outputs of the folded cascode amplifier, means for producing a reference current $I_o$ dependent on a bias voltage equal to the desired common mode voltage of the folded cascode amplifier, and means for ensuring that the sum $C_1$ of the currents flowing through said pair of voltage-dependent resistor means is equal to said reference current, and means for deriving a common mode voltage signal from said reference current to maintain the common mode output voltage of said cascode amplifier equal to said reference voltage.

9. A power amplifier as claimed in claim 8, characterized in that said voltage-dependent resistor means comprise transistors operating in the triode region.

10. A power amplifier as claimed in claim 8 characterized in that said common mode voltage feedback control circuit comprises first and second parallel paths through which said respective currents $I_o$ and $I_1$ flow, said first path including a pair of parallel-connected transistors with their gates tied to said reference voltage serving as a current sources and being in series with a further transistor, and said second path including said pair of voltage-dependent resistors in series with a further transistor, the further transistors of the respective paths being matched and having their gates connected together to ensure the currents in the two paths remain the same, and the common mode feedback control signal being produced at the drain of said further transistor in the first path.

11. A power amplifier as claimed in claim 10, comprising an additional transistor in each said path, said additional transistors having their gates connected together and tied to a second reference voltage source.

* * * * *